United States Patent [19]

Harrison, Jr.

[11] Patent Number: 4,578,676
[45] Date of Patent: Mar. 25, 1986

[54] DELAY LATTICE FILTER FOR RADAR DOPPLER PROCESSING

[75] Inventor: Earnest R. Harrison, Jr., Severna Park, Md.

[73] Assignee: Westinghouse Electric Corp., Pittsburgh, Pa.

[21] Appl. No.: 604,331

[22] Filed: Apr. 26, 1984

[51] Int. Cl.⁴ .................. G015 7/28; G015 13/52; G015 13/00
[52] U.S. Cl. .................. 343/17.1 R; 343/7.7; 343/7 A; 343/5 NQ
[58] Field of Search .............. 343/7 A, 7.7, 5 NQ, 343/17.1

[56] References Cited

U.S. PATENT DOCUMENTS 4,086,592 4/1978 Lewis et al. .................. 343/7.7 X
4,119,962 10/1978 Lewis .................. 343/5 NQ X Primary Examiner—Thomas H. Tarcza
Assistant Examiner—Mark Hellner
Attorney, Agent, or Firm—W. E. Zitelli

[57] ABSTRACT

An adaptive filter for enhancing the discrimination of targets from clutter and noise and suitable for use in a pulse doppler radar signal processor which processes successive echo pulse period signalling in accordance with range cell samples is disclosed. One embodiment of the filter has a delayed lattice configuration including a plurality of cascadedly coupled lattice stages, each adapted to operate on the range cell samples of first and second complex signal inputs. The adaptive filter embodiment provides rapid and low cost updating of the lattice stage weighting coefficients so that varying clutter spectrums may be effectively dealt with. Moreover, the lattice filter embodiment is insensitive to average clutter motion and to transmitter phase and gain instabilities. It further permits the use of variable interpulse period operation in radars that are unambiguous in range. Furthermore, the lattice filter embodiment adapts to and whitens the actual clutter spectrum being received by the radar and not some model spectrum that may be quite inaccurate.

7 Claims, 7 Drawing Figures

DELAY LATTICE FILTER FOR RADAR DOPPLER PROCESSING

BACKGROUND OF THE INVENTION

The present invention relates to radar doppler processors in general, and more particularly to a pulse doppler radar signal processor which includes an adaptive filter having a delay lattice configuration for enhancing the discrimination of targets from clutter and noise in the radar processing of the received radar signalling.

Modern radars, like the one depicted in the block diagram schematic of FIG. 1, for example, include a variety of means for discriminating targets from clutter and noise. In operation, a transmitter 10 may generate transmission RF energy pulses at either a fixed interpulse period (IPP) as depicted by the time waveform 2A or variable interpulse periods (VIP) as depicted by the time waveform 2B in which exemplary ratios of the varying interpulse periods thereof are designated by the figures: $29':32':31':41':34':\ldots$ under the interpulse periods thereof. The generated RF energy pulses are transmitted into space via a conventional circulator 14 and antenna system 16.

Echo signalling from targets, clutter, chaff, rain, and the like, may be received during the interpulse periods by the antenna system 16 and conducted to a receiver unit 18 via the circulator 14. The received echo signalling may be conditioned from RF to IF or video signalling 20 in the receiver 18 and then sampled and digitized in accordance with predetermined range cells in a conventional sampling analog-to-digital (A/D) converter 22. The range sampled echo signalling may be conducted to post processing apparatus 24 for the detection of targets.

In the example as shown, apparatus 24 includes a moving target indicator (MTI) 26 which may include high pass filters consisting of one or more transfer function parameters to filter out the clutter from the digitized echo signalling based on the spectral characteristics thereof. The transfer function parameters are normally fixed at the design time of the MTI for the optimum removal of a specific type of clutter spectrum or a specific group of clutter types, like rain, chaff, or the like. Generally, the only adaptivity provided in a moving target detection apparatus is that which may be provided in a conventional constant false alarm rate (CFAR) detection unit 28 cascadedly coupled thereto. Normally, the detection threshold level of the CFAR 28 is rendered above the noise plus residue clutter level of the digitized echo signalling. Accordingly, a signal output from the CFAR unit 28 is an indication of a detected moving target.

One of the drawbacks of these type MTI radar processing systems is that if the actual clutter spectrum received by the radar differs from that originally designed for in the response characteristics of the MTI filter 26, then the process for detecting moving targets will be degraded. This phenomenon is illustrated in the graph of FIG. 3 wherein the curve 30 exhibits an exemplary MTI filter response over a doppler frequency spectrum. The response 30 has a primary clutter notch in the region 32 for attenuating clutter in the echo signalling having doppler frequencies within the region 32. One type of target detection degradation may result from a clutter spectrum, such as that shown by the curve 38, for example, being excessive and overlapping the passband of the MTI filter response characteristics 30 wherein that portion of the clutter spectrum as denoted by the shaded area 40 will not be removed and passed accordingly to the CFAR unit 28.

Another drawback may result from attempting to widen the primary clutter notch to include a greater doppler spectrum of clutter in which case secondary clutter notches like the ones shown at 34 and 36 may develop. Accordingly, another type of target detection degradation will result from excessive attenuation of desired echo signalling due to the secondary clutter notches at 34 and 36, for example, which are too wide for practical use. Under these filter response conditions, the echo signalling having doppler frequencies falling within the doppler regions, i.e., 34 and 36, will not pass to the CFAR unit 28 and not be processed for target detection thereby. Of course, it is understood that a combination of these two effects is also very possible.

Another type of moving target detector, one having doppler filter banks, has been applied to the problem of clutter rejection and has been found to provide a slight increase in doppler frequency filter adaptivity by allowing use of independent CFAR detectors on each filter output. Thus, an individual filter response can be varied somewhat to match the clutter characteristics thereof. However, since the actual filter response characteristics must be shaped in advance, the individual filter will be optimum for only that clutter model chosen at the time of design and not for the clutter spectrum actually received by the radar. Such parameters as the main lobe width and position (32) and consequently, the sidelobe levels (34 and 36) as well are normally fixed at the time of the individual filter design.

A further drawback of most of the filter bank type moving target detection systems is that they are suitable for use only with a radar which transmits fixed interpulse periods. Thus, the clutter rejection regions formed by the filter banks are replicated at multiples of the pulse repetition frequency of the radar, more commonly known as blind speed intervals. To insure that target detection is observable over the doppler frequency spectrum, radars generally transmit several observation bursts of pulses, each with a different pulse repetition frequency or carrier frequency for each search resolution range cell in order to observe targets through the blind speeds of the doppler frequency spectrum. Since it is well known that these bursts of pulses must be combined noncoherently, the additional observation time implied by the multiple bursts do not translate into improved spectral or cross range resolution.

There is a certain class of processing filters known as adaptive lattice predictive filters which have been proposed for digital signal processing, in general, and more especially with regard to applications to spectral line enhancement, spectral estimation and speech enhancement signal processing. Examples of these adaptive lattice predictor filters are described in the following references:

(1) N. Ahmed and R. J. Fogler "On An Adaptive Lattice Predictor and a Related Application", IEEE Circuits and Systems Magazine, Vol. 1, No. 4, pgs. 17–23;

(2) J. Makhoul, "Stable and Efficient Lattice Methods for Linear Production", IEEE Transactions on Acoustics, Speech, and Signal Processing, Vol. ASSP-25, No. 5, October, 1977; and (3) M. Morf, et al, "Efficient Solution of Covariance Equations for Linear Prediction", IEEE Transactions on Acoustics, Speech, and Signal Processing, Vol. ASSP-25, pgs. 429–433, October, 1977.

The tapped weighted delay line or transversal filter type described in the aforementioned papers is operative to linearly predict the contents of a particular range cell from a weighted sum of past data on that range cell and from knowledge of the covariance matrix that represents nearby range cells. In this case, the covariance matrix represents the background to be removed. That part of the incoming data that can be predicted is assumed to be background and is removed by subtraction to form the residue. The residue, then, is composed of the "unpredictable" data: white noise and targets; the filterable clutter has been removed. This type of predictive filter removes clutter by adapting to its spectrum and filtering it out. While being an improvement over the type of clutter filters heretofore described, it also has a drawback of high computational overhead. More specifically, a full N by N covariance matrix must be estimated from the incoming echo signalling and thereafter inverted in the digital signal processing operation. As a result, very high precision arithmetic and apparatus for carrying it out must be used in this type of predictor filter to avoid general round-off problems.

Another of the adaptive lattice predictive filters described in the aforementioned papers provide similar linear prediction processing without the drawback of high precision arithmetic. This other lattice filter is referred to as the delay lattice filter and includes a number of cascaded lattice stages as opposed to a tapped delay line. The delay lattice filter arrangement requires only a scaler correlation estimate to be made for each stage which replaces the N by N covariance matrix inversion step of the tapped delay line, thus alleviating that computational overhead.

Applications of these adaptive lattice predictive filters are primarily proposed for the digital signal processing of data streams coming from speech or seismic measurements which are mostly one dimensional in nature. Since the data streams from speech sources and the like are strictly of a linear form, there is nothing to integrate over except time spent in going from one stage to another stage in the lattice filter. In processing the linear data, there is nothing which really distinguishes delay data from current data, which causes problems in picking the time delays of the various stages and trying to cancel delay data from non-delay data.

In addition, these lattice type filters are proposed to operate only on signals which are stationary or nearly stationary, i.e., their statistics are changing very slowly, because the estimated values of their reflection coefficients k1, k2, . . . can follow only slow variation in input signal statistics as a result of the derivation thereof. This type of processing is adequate if the phase progression of the input signal from stage to stage of the filter will remain fairly constant over a long period of time or vary slowly. On the other hand, in a radar application especially with variable interpule period transmissions, there may be an echo signal phasor that is rotating very rapidly, may be several hundred $2\pi$ rotations per second, for example. Accordingly, with variable interpulse period radar operation, the range sampling rate changes so that there is a very rapid variation in phase between the same range samples from range sweep to range sweep, i.e., azimuthal change of the phase progression of a particular input echo signal phasor. The operational capability of the delay lattice linear predictors will not function adequately under this kind of a scenario where the amplitude or phase progression changes by large amounts from sample-to-sample.

To summarize, then, it is of paramount importance to provide a target detection filter in the post processing radar stages that can adapt to the varying clutter and noise spectrums received and generated by the radar to enhance target detection. The class of adaptive lattice predictive filters do offer filter adaptivity for certain types of digital signalling. However, the tapped weighted delay line or transversal filter involves complex matrix manipulations which creates high computational overhead. On the other hand, the delay lattice filter structure can perform the filtering process much simpler but has not as yet been shown to be adequately operational for target detection processing of a radar, especially with regard to variable interpulse period transmissions.

SUMMARY OF THE INVENTION

In accordance with the present invention, an adaptive filter for enhancing the discrimination of targets from clutter and noise is included in a pulse doppler radar signal processor which processes successive echo interpulse period (IPP) signalling in accordance with range cell samples. The filter has a delay lattice configuration including a plurality of cascadedly coupled lattice stages, each adapted to operate on the range cell samples of first and second complex signal inputs.

More specifically, a typical lattice stage includes a means for delaying the second complex signal input over a time interval to render the delayed range cell samples thereof, corresponding to a previous IPP, coherent with the range cell samples of the first complex signal input corresponding to a current IPP. The stage further includes means for computing independently a first coefficient signal and a second coefficient signal for each range cell sample of the current IPP based on respective separate functions of a common multiplicity of coherent range cell samples of the first and delayed second complex signal inputs. The common multiplicity of coherent range cell samples may be grouped about the range cell sample for which the first and second coefficient signals are being computed. Accordingly, the stage includes apparatus for weighting each range cell sample of the first and second complex signals with the respective second and first coefficient signal correspondingly computed therefor. Each range cell sample of the first complex signal input corresponding to a current IPP is combined with the coherent weighted range cell sample of the delayed second complex signal input to form a first complex signal output of the lattice stage. Similarly, each range cell sample of the delayed second complex signal input corresponding to a current IPP is combined with the coherent weighted range cell sample of the first complex signal input to form a second complex signal output of the lattice stage.

In one embodiment, the first coefficient signal for each range cell i is computed by estimating a first expected signal representative of the product of the complex conjugate of the range cell sample i of the delayed second complex signal input and the coherent range cell sample i of the first complex signal input as a first function of the common multiplicity of coherent range cell samples of both the first and delayed second complex signal inputs grouped about range cell i, estimating a second expected signal representative of the squared absolute value of the range cell sample i of the delayed second complex signal input as a function of the common multiplicity of coherent range cell samples of both the first and delayed second complex signal inputs grouped about range cell i and dividing the first expected signal of the range cell i by the second expected signal of the range cell i to form the first coefficient signal therefor. In addition, the second coefficient signal for each range cell i is computed by estimating a third expected signal representative of the product of the complex conjugate of the range cell sample i of the first complex signal input and the coherent range cell sample i of the delayed second complex signal input as a third function of the common multiplicity of coherent range cell samples of both the first and delayed second complex signal inputs grouped about range cell i, estimating a fourth expected signal representative of the squared absolute value of the range cell sample i of the first complex signal input as a fourth function of the common multiplicity of coherent range cell samples of both the first and delayed second complex signal inputs grouped about range cell i, and dividing the third expected signal of the range cell i by the fourth expected signal of the range cell i to form the second coefficient signal therefor.

DESCRIPTION OF THE PREFERRED EMBODIMENT

Figure 4:
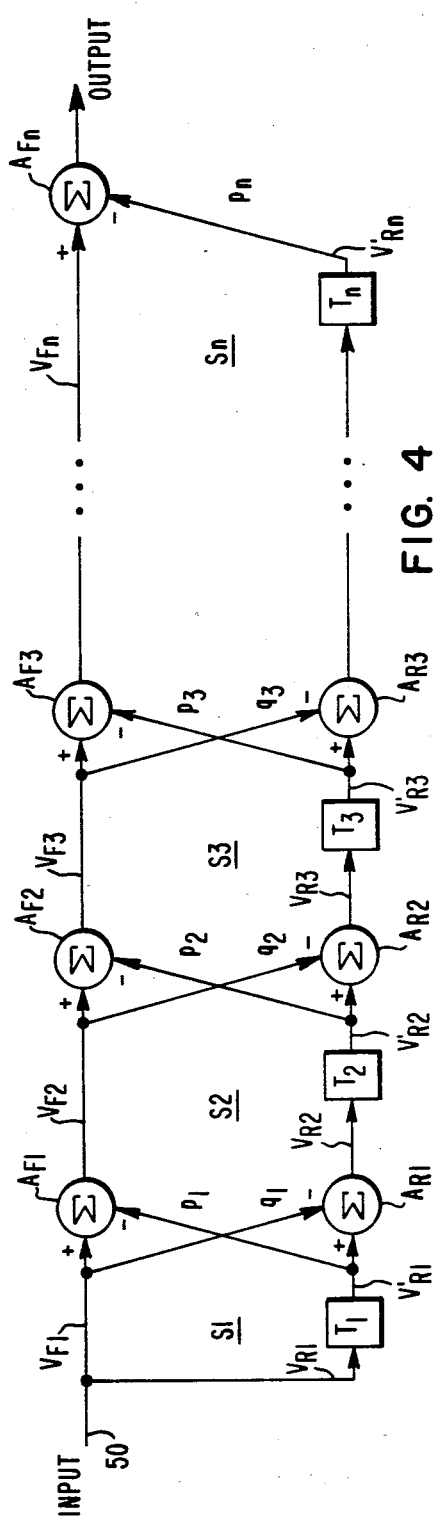
FIG. 4 is a schematic diagram of a typical delay lattice filter embodiment.

A typical delay lattice filter embodiment is depicted in the schematic diagram of FIG. 4. The delay lattice filter includes a plurality of cascadedly coupled lattice stages S1, S2, S3, . . . , Sn. Range sampled echo signals of successive interpulse periods may be input to the lattice filter at the input line 50 thereof. Each lattice stage Si is adapted to operate on the range cell samples of first and second complex signal inputs denoted as $V_F$ and $V_R$, respectively. Each lattice stage S1 through Sn includes a delay function $T_1$ through $T_n$, respectively. In each case, the delay function delays the second complex signal $V_R$ over a time interval to render the delayed range cell samples thereof, denoted as $V'_R$, corresponding to a previous IPP, coherent with the range cell samples of the first complex signal input $V_F$ corresponding to a current IPP.

Each stage includes weighting coefficients $p_i$ and $q_i$ for weighting the delayed second complex signal $V'_{Ri}$ and the first complex signal $V_{Fi}$, respectively. Generally, summing units $A_{Fi}$ and $A_{Ri}$ are included in each lattice stage $S_i$ for combining signals. For example, the summer $A_{Fi}$ may combine the range cell samples of the first complex signal $V_F$ corresponding to a current IPP with the coherent weighted range cell samples of the delayed second complex signal $V'_R$ to form a first complex signal output of the lattice stage which becomes the first complex signal input of the next stage coupled cascadedly therewith. Similarly, the summer $A_{Ri}$ may combine each range cell sample of the delayed second complex signal $V'_R$ corresponding to a current IPP with the coherent weighted range cell samples of the first complex signal $V_F$ to form a second complex signal output of the lattice stage which becomes the second complex signal input to the next stage cascadedly coupled therewith. The output of the lattice filter results from the final combination of signals in the summer $A_{Fn}$.

Figure 5:
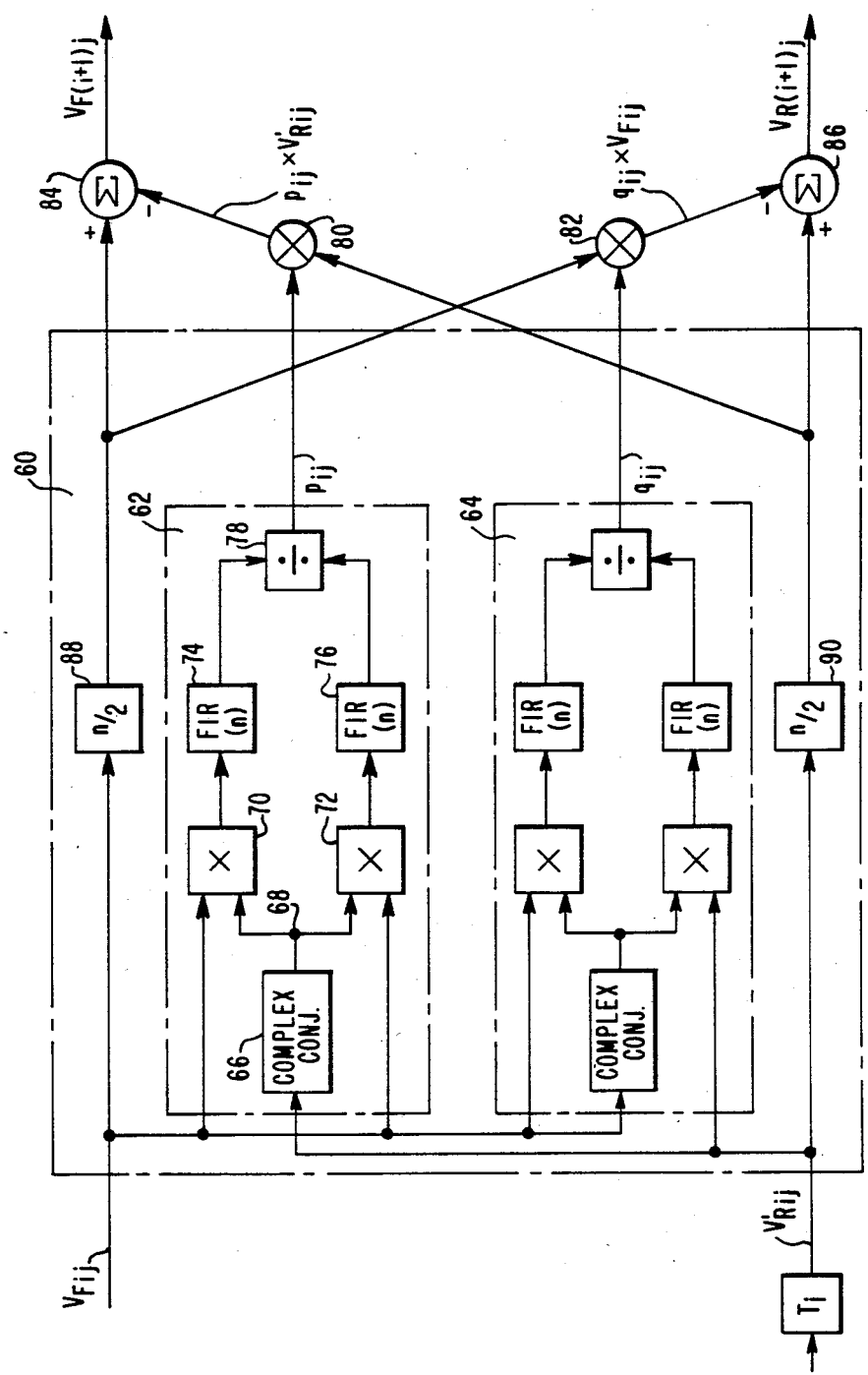
FIG. 5 is a block diagram schematic depicting an exemplary stage of an adaptive lattice filter suitable for embodying the broad principles of the present invention.

The block diagram schematic of FIG. 5 depicts a suitable embodiment of an exemplary stage i of an adaptive lattice filter in accordance with the broad principles of the present invention. Disposed in the lattice stage i is a computing section 60 which includes the separate sections 62 and 64 for independently computing the first coefficient signal $p_i$ and the second coefficient signal $q_i$, respectively, for each of the range samples j corresponding to a current interpulse period.

The first coefficient $p_i$ may be calculated in the computing section 62 in accordance with the following formula:

$$p_i = \frac{< V^*_{Ri} \cdot V_{Fi} >}{< |V_{Ri}|^2 >}, \text{ for each range cell sample } j, \quad (1)$$

Where * represents complex conjugate and < > represents an estimate of the expected value.

In accordance with equation (1), the computing section 62 may include a complex conjugate function 66 for taking the complex conjugate of each range cell sample j of the delayed second complex signal $V'_{Rij}$ and conducting the resulting signal 68 to an input of each of two multiplier units 70 and 72. The other input of multiplier 70 may be coupled to the first complex signal $V_{Fi}$ and the other input of the multiplier 72 may be coupled to the signal $V'_{Ri}$. The product signal outputs of the multipliers 70 and 72 may be provided respectively to corresponding estimating devices 74 and 76 which operate independently on a common multiplicity n of coherent range cell samples of the corresponding product signals provided thereto.

The estimating devices 74 and 76 may operate as a range cell sliding window function to derive the expected numerator and denominator signals (refer to eq. 1) of their corresponding product signal inputs for each range cell sample j delayed by an average of n/2 range cell samples. The derivation may or may not include the range cell sample j. In the present embodiment, finite impulse response (FIR) filters are used for the estimating devices 74 and 76. Each finite impulse response filter has an impulse response over a sliding window of range cells which straddle the range cell j for which the associated expected product signal is being estimated in each case. The expected numerator and denominator signals representative of their corresponding product signals are divided in unit 78 in accordance with equation (1) to provide the first coefficient signal $p_{ij}$.

The second coefficient signal $q_i$ may be calculated in the computing section 64 in accordance with the following formula:

$$q_i = \frac{<V_{Fi}^* \cdot V_{Ri}>}{<|V_{Fi}|^2>}, \text{ for each range cell sample } j. \quad (2)$$

Where * represents complex conjugate and < > represents an estimate of the expected value.

In accordance with eq. (2), the second computing section 64 has a similar arrangement of computational blocks as that of the first computing section 62. Accordingly, the computing blocks of section 64 are arranged to satisfy the formula (2) to produce a second coefficient signal $q_{ij}$.

While finite impulse response filters are proposed for use in the present embodiment for deriving a statistical average from a multiplicity of range cell signal samples, it is understood that other ensemble range cell signal averaging methods may be used to estimate the expected product values without deviating from the broad principles of the present invention. One such method is commonly referred to as the decaying exponential filter which functions in accordance with the following formula.

$$A_i := A_i + R \cdot (V_{Ri}'^* \cdot V_{Fi} - A_i) \quad (3)$$

where [:=] represents replace; $A_i$ is the current estimate of the statistical product value, that is $V_{Ri}'^* \cdot V_{Fi}$; and R represents a factor controlling the time constant of the filter. It is further understood that there may be other recursive filters which again would operate to take as input data the range cell samples somewhat in advance of the current range cell i so that the impulse response thereof straddles the range cell of interest. In any event, the statistical filtering process is performed separately on the numerator product signal and denominator product signal of the fractions of equations (1) and (2) in which case the filtering is made substantially the same for each quantity.

Additionally disposed in the exemplary stage of the lattice filter may be two multipliers 80 and 82. Multiplier 80 may be used to weight the range cell samples j of the delayed second complex signal $V_{Ri}'$ by the first coefficient $p_{ij}$ derived for the range cell j. The resulting products for each range cell are provided to a summing unit 84 to be combined with coherent range cell samples of the first complex signal $V_{Fij}$. In the present embodiment the combination function includes subtracting the weighted second complex signal from the first complex signal in accordance with coherent range samples j to effect a first output complex signal $V_{F(i+1)j}$. Similarly, the multiplier 82 provides for weighting the first complex signal $V_{Fij}$ by the second weighting coefficient $q_{ij}$ derived corresponding therefor. Again, the resulting product is provided to a summer unit 86 in which it is subtracted from the delayed second complex signal in accordance with coherent range cell samples j to effect a second complex signal output $V_{R(i+1)j}$.

In order to accommodate the time delays of the estimating devices, like 74 and 76, for example, of the computing sections 62 and 64 which operate over a multiplicity of range cells n, delays 88 and 90 may be included in the signal line paths of the first complex signal and delayed second complex signal, respectively, to render coherent range cell sample combinations in the combiners 84 and 86. For example, if the weighting coefficients are being computed for a range cell which is mid range to the multiplicity n of range cell samples, then the delays 88 and 90 may be adjusted to delay their corresponding signals n/2 range cells in each case.

Figure 1:
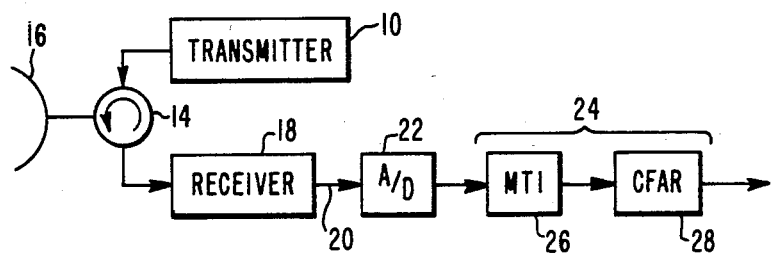
FIG. 1 is a block diagram schematic of a radar embodiment suitable for embodying the present invention.
Figure 2:
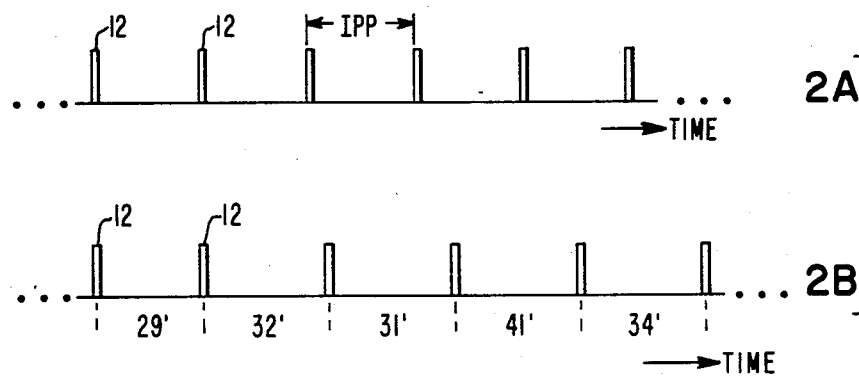
FIGS. 2A and 2B are time graphs exemplifying a fixed interpulse period waveform and a variable interpulse period waveform, respectively.
Figure 3:
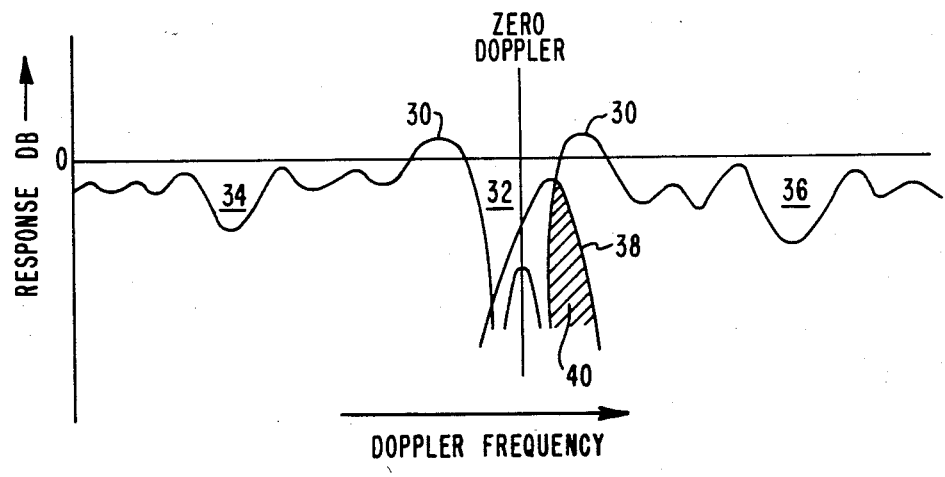
FIG. 3 is a graph illustrating the phenomenon in which the actual clutter spectrum received by a radar differs from that designed in the response characteristics of an MTI filter which causes the process for detecting moving targets to become degraded.
Figure 6:
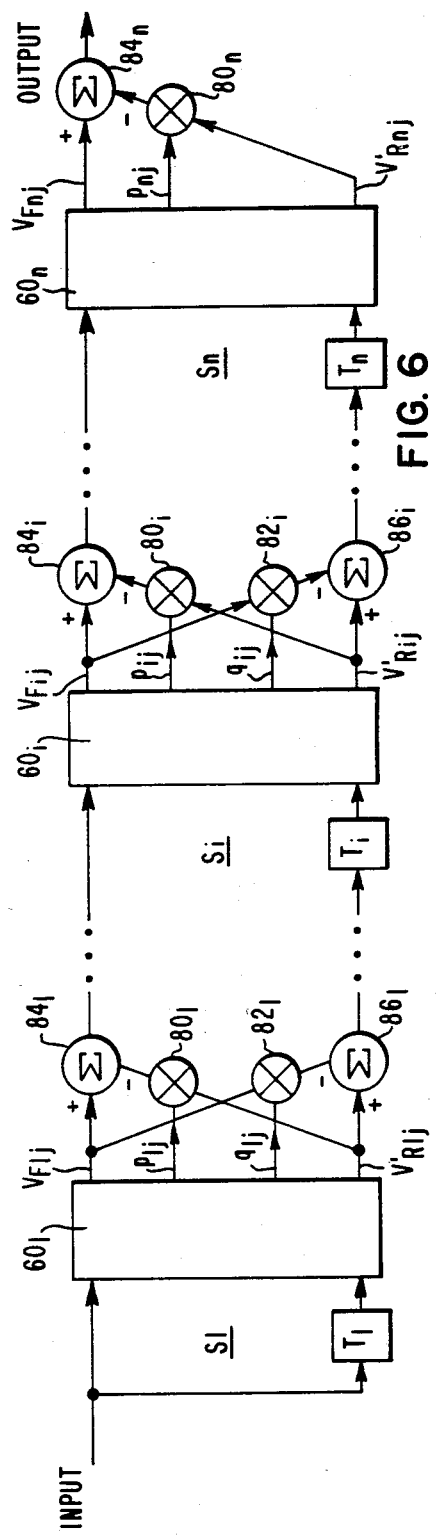
FIG. 6 is a block diagram schematic of a lattice filter suitable for embodying the inventive aspects described in connection with FIG. 5.

The block diagram schematic of FIG. 6 illustrates a lattice filter including the computing section 60 at each lattice stage thereof. Also included in each lattice stage are the multipliers 80 and 82 and the summing units 84 and 86. While the last stage n of the n-stage lattice filter of this embodiment is shown not including the multiplier and summer unit 82 and 86, respectively, it may be, as a matter of economics, better to have all stages the same. The lattice filter embodiment of FIG. 6 may be included in the radar post processing apparatus as a target indicator, like the one shown at 26 in FIG. 1, for example, which processes successive echo interpulse period signalling in accordance with the range cell sampling of the A/D converter 22 preceding it.

In a typical operation, the range cell samples of a first IPP of a new set of successive IPP's of echo signalling may sequentially enter the first stage S1 of the lattice filter. Each new set of successive interpulse periods generally comes about as a result of acquisition of new data, or a change in the RF transmission frequency, or as a result of a new radar look direction. Initially, there is no correlation with any data within the filter, and all of the weighting coefficients $p_i$ and $q_i$ are zero. In addition, because of the delay function $T_1$ of the first stage, there will be no signal existing at $V'_{R1j}$. Thus, the lattice filter output, will be the same as the input for the first interpulse period of the successive set. In the radar post processing, the output signal is usually detected and normalized in amplitude using well-known CFAR techniques and the normalized output is integrated. These functions may take place in the CFAR unit 28, for example.

As the second interpulse period of the successive set enters the lattice filter, the range cell samples thereof correlate with the range cell samples delayed from the previous interpulse period in lattice stage 60, to permit the computation of the weighting coefficients $p_1$ and $q_1$ for each range cell j in accordance with the degree of correlation between the multiplicity n of range cell samples of the delayed first and second interpulse periods which are statistically averaged over the sliding range cell window of the estimating devices as described in connection with the embodiment of FIG. 5. Note that the downstream weighting coefficients, that is, for stages 2 through n, remain zero after only two interpulse periods of the successive set. The lattice filter at this point in time is representative operationally as an optimum two-pulse clutter canceller. The output of the lattice filter is again detected, normalized and integrated by the CFAR 28.

The ith interpulse period causes the weighting coefficients $p_1$, $q_1$, $p_2$, $q_2$, ... $p_i$, $q_i$ to be non-zero for the current range cell samples j thereof. Noteworthy is the fact that the weighting coefficients p and q for each active stage are continuously recomputed for each range cell sample j and for each successive interpulse period. The lattice filter during the ith interpulse period is representative in operation of an optimum i-pulse clutter canceller. Accordingly, the range cell processing of all succeeding interpulse periods proceed in a similar manner as that described hereabove until the first interpulse period of range cells passes through the final delay $T_n$ of the nth stage during which time the weighting coefficient $p_{nj}$ is being derived. At this time, the effective length of the lattice filter ceases to grow and then operates as an optimum n-pulse clutter canceller where n is one more than the number of filter delay elements.

It is well known that successive outputs of the lattice filter are statistically orthogonal until the lattice filter "fills". After this point, approximate orthogonality is maintained. The output of the lattice filter, after "filled", contains only that echo signalling data that is "unpredictable", that is, white noise, white clutter residue and targets. Targets are unpredictable because they fall in only one or two range cells and do not significantly affect the statistical range cell signal averaging taking place in the lattice filter stages. However, the clutter residue is whitened by the lattice filter stages. The normalized lattice filter output is provided to a non-coherent integration processing step in the CFAR unit 28, for example.

Another way of describing the operation of the lattice filter as described in connection with the embodiments of FIG. 5 and FIG. 6 is that each new IPP of the succession is predicted from the past n IPP's stored within the lattice filter stages and the predicted value is subtracted from the input signal, the lattice filter architecture of FIG. 6 being simply an efficient way of accomplishing this. Thus, what emerges from the lattice filter output is a signal which is unpredictable, as stated above, even if the complex input signal has been phase shifted from interpulse period to interpulse period, say due to transmitter instabilities, for example. The lattice filter operation is adaptable to compensate for these phase shift instabilities by rotating the stored data as necessary from lattice stage to lattice stage to match this phase shift and predict the new data just as well as if there had been no phase shift at all. Moreover, transmitter gain instabilities may be handled in much the same manner. Thus, transmitter instabilities are effectively removed from the incoming echo signal data stream of the successive interpulse periods.

Furthermore, present lattice filter embodiments, like those which have been described in the Background section hereabove, generally require that the input data statistics be Toeplitz or shift invariant, which are terms commonly meaning that the clutter signalling is statistically stationary. The lattice filter embodiment described in connection with FIGS. 5 and 6 have no such limitations, as previously shown, and permit the use of variable interpulse period illumination pattern radar operation.

In summary, the embodiment of the lattice filter architecture of FIGS. 5 and 6 may be applied as an adaptive MTI clutter canceller to provide rapid and low cost updating of the lattice stage weighting coefficients so that varying clutter spectrums may be effectively dealt with. The lattice filter embodiment is insensitive to average clutter motion and to transmitter phase and gain instabilities. It furthermore permits the use of variable interpulse period operation in radars that are unambiguous in range. Moreover, the lattice filter embodiment adapts to and whitens the actual clutter spectrum being received by the radar and not some model spectrum that may be quite inaccurate.

While aspects of the present invention have been described in connection with a particular embodiment as depicted in FIGS. 5 and 6 hereabove, it is understood that other embodiments may also be used to serve the same functional purpose without deviating from the broad principles of the present invention as recited in the appended claims.

I claim:

1. In a pulse doppler radar signal processor which processes successive echo interpulse period (IPP) signalling in accordance with range cell samples, an adaptive filter for enhancing the discrimination of targets from clutter and noise, said filter having a delay lattice configuration including a plurality of cascadedly coupled lattice stages, each adapted to operate on the range cell samples of first and second complex signal inputs, a lattice stage comprising:

means for delaying said second complex signal input over a time interval to render the delayed range cell samples thereof, corresponding to a previous IPP, coherent with the range cell samples of said first complex signal input corresponding to a current IPP;

means for computing independently a first coefficient signal and a second coefficient signal for each range cell sample of said current IPP based on respective separate functions of a common multiplicity of coherent range cell samples of said first and delayed second complex signal inputs, said common multiplicity of coherent range cell samples being grouped about said range cell sample for which said first and second coefficient signals are being computed;

first means for weighting each range cell sample of said first complex signal input with the second coefficient signal correspondingly computed therefor;

second means for weighting each range cell sample of said delayed second complex signal input with the first coefficient signal correspondingly computed therefor;

first means for combining each range cell sample of said first complex signal input corresponding to a current IPP with said coherent weighted range cell sample of said delayed second complex signal input to form a first complex signal output of the lattice stage; and second means for combining each range cell sample of said delayed second complex signal input corresponding to a current IPP with said coherent weighted range cell sample of said first complex signal input to form a second complex signal output of the lattice stage.

2. The adaptive filter in accordance with claim 1 wherein the computing means includes:

first means for computing a first coefficient signal for each range cell i corresponding to a current IPP comprising:

means for estimating a first expected signal representative of the product of the complex conjugate of the range cell sample i of the delayed second complex signal input and the coherent range cell sample i of the first complex signal input as a first function of the common multiplicity of coherent range cell samples of both the first and delayed second complex signal inputs grouped about range cell i;

means for estimating a second expected signal representative of the squared absolute value of the range cell sample i of the delayed second complex signal input as a second function of the common multiplicity of coherent range cell samples of both the first and delayed second complex signal inputs grouped about range cell i; and means for dividing said first expected signal of said range cell i by said second expected signal of said range cell i to form said first coefficient signal for said range cell i; and second means for computing a second coefficient signal for each range cell i corresponding to a current IPP comprising:

means for estimating a third expected signal representative of the product of the complex conjugate of the range cell sample i of the first complex signal input and the coherent range cell sample i of the delayed second complex signal input as a third function of the common multiplicity of coherent range cell samples of both the first and delayed second complex signal inputs grouped about range cell i;

means for estimating a fourth expected signal representative of the squared absolute value of the range cell sample i of the first complex signal input as a fourth function of the common multiplicity of coherent range cell samples of both the first and delayed second complex signal inputs grouped about range cell i; and means for dividing said third expected signal of the range cell i by said fourth expected signal of said range cell i to form said second coefficient signal for said range cell i.

3. The adaptive filter in accordance with claim 2 wherein each of the estimating means for estimating the first, second, third and fourth expected signals includes a range cell sliding window filter in which statistical averages are taken from the associated products corresponding to the common multiplicity of coherent range cell samples of said sliding window.

4. The adaptive filter in accordance with claim 3 wherein the sliding window filter includes a finite impulse response filter having an impulse response over a sliding window of range cells which straddles the range cell i for which the associated expected signal is being estimated.

5. The adaptive filter in accordance with claim 2 wherein each of the estimating means for estimating the first, second, third and fourth expected signals includes a decaying exponential filter for operating on the associated products corresponding to the common multiplicity of coherent range cell samples.

6. The adaptive filter in accordance with claim 1 wherein each first and second weighting means includes a multiplier for multiplying each range cell sample of its associated complex signal input with the corresponding coefficient signal computed therefor.

7. The adaptive filter in accordance with claim 1 wherein the first combining means includes means for subtracting each weighted range cell sample of the delayed second complex signal input from the coherent range cell sample of the first complex signal input to form the first complex signal output; and wherein the second combining means includes means for subtracting each weighted range cell sample of the first complex sample input from the coherent range cell samples of the delayed second complex signal input to form the second coupler signal output.

* * * * *